United States Patent [19]

Stroppiana

[11] Patent Number: 4,716,309
[45] Date of Patent: Dec. 29, 1987

[54] STATIC RELAY FOR LOW DC VOLTAGES
[75] Inventor: Robert J. Stroppiana, Paris, France
[73] Assignee: U.S. Philips Corporation, New York, N.Y.
[21] Appl. No.: 731,814
[22] Filed: May 8, 1985
[30] Foreign Application Priority Data
  May 11, 1984 [FR] France .................. 8407308
[51] Int. Cl.[4] .................. H03K 17/08; H03K 17/04
[52] U.S. Cl. .................. 307/442; 307/248; 307/254; 307/573; 340/650; 340/652
[58] Field of Search .................. 307/442, 10 LS, 248, 307/570, 571, 573, 253, 254; 340/649, 650, 652

[56] References Cited
U.S. PATENT DOCUMENTS

| 4,286,175 | 8/1981 | Baker | 307/581 |
| 4,604,535 | 8/1986 | Sasayama et al. | 307/570 |
| 4,609,832 | 9/1986 | Mehl | 307/270 |

Primary Examiner—Stanley D. Miller
Assistant Examiner—Richard Roseen
Attorney, Agent, or Firm—Robert T. Mayer; Bernard Franzblau

[57] ABSTRACT

A static relay for low DC voltages includes output transistor ($T_s$) with its emitter connected to an output terminal supplying a load (Z) further connected to a common supply terminal. The base of the output transistion ($T_s$) is supplied via the main current path of a current injection transistor ($T_i$) acted upon via a control electrode. The current injection transistor ($T_i$) is supplied with an auxiliary voltage ($V_{aux}$) which is higher than the voltage ($V_{bat}$) feeding the output transistor ($T_s$). A detection transistor ($T_c$) has its emitter-base path, which includes a base resistor ($R_b$), connected parallel to the base-emitter path of the output transistor ($T_s$) and delivers at its collector a detection signal representative of the state of the load (Z).

22 Claims, 15 Drawing Figures

STATIC RELAY FOR LOW DC VOLTAGES

BACKGROUND OF THE INVENTION

This invention relates to a static relay for low DC-voltages to be supplied to a load. The relay comprises a bipolar output transistor of a first conductivity type whose emitter is connected to an output terminal to which the load is to be connected. The load is further connected to a common supply terminal. The collector of the transistor is connected to a main supply terminal, and the base of this transistor is fed through the main current path of a current injection transistor, which has a control electrode which, when it is operated via a control terminal, causes this transistor and also the bipolar output transistor to become conductive.

Such a static relay can be utilized in the field of electrical equipment for automobiles, in which application it replaces advantageously the conventional systems comprising electromagnetic relays.

French Patent Application No. 2,524,711 filed by "General Electric Company-US" and published on Oct. 7th 1983 discloses a static relay of the aforementioned type.

Such a relay is not adapted to use in electrical equipment for automobiles, for which the various bulbs have to be fed by control transistors at the nominal voltage of the battery and for which the circuit has to permit the identification of anomalies relative to the load, i.e. non-connection of shortcircuiting of this load. According to preferred embodiments the relay should also provide protection from anomalies relative to the electric supply of the relay.

SUMMARY OF THE INVENTION

The invention thus relates to a device of the aforementioned type which comprises a bipolar detection transistor of a second conductivity type opposite to the first type, whose emitter-base path, to which a base resistor is added, is connected parallel to the base-emitter path of the bipolar output transistor. The collector of the detection transistor produces a signal representative of the state of the load.

The detection transistor thus provides, as will be shown in the following description, a detection signal at its collector which gives information about the state of the load, i.e. whether it is normal, is disconnected or is shortcircuited.

The relay according to the invention can be in the form of an integrated circuit.

According to a preferred embodiment, the current injection transistor is connected to an auxiliary supply terminal.

The auxiliary supply terminal supplies the current injection transistor with an auxiliary voltage exceeding the supply voltage delivered at the main supply terminal which, in a medium power application of the envisaged kind, makes it possible the energy losses which are considered unacceptable and which are related to the different inevitable voltage drops.

The energy consumption of the relay can be reduced in that the current injection transistor is in the form of a MOS field effect transistor of the enhancement type having a channel of the second conductivity type, whose gate, which constitutes the control electrode, is connected through a polarization resistor to its source, its drain feeding the base of the bipolar output transistor. In practice, the base current of the output transistor can be limited in a satisfactory manner due to the internal resistance of the current injection transistor so that the drain of the latter can be directly connected to the base of the output transistor.

According to a first modification, a control voltage received at the control terminal is fed to the gate of the injection transistor and the collector of the detection transistor is connected to the control terminal through a first protection diode arranged in the normally forward direction of the current originating from the collector of the detection transistor so that the control terminal also serves to deliver a detection signal. An additional circuit can then be provided for interrupting the operation of the relay in the case of anomalies. Protection against the disconnection of the main supply source, for example the battery of an automobile, is obtained by means of a protection field effect transistor of the MOS type, whose gate is connected to the main supply terminal, whose source is connected to the control terminal and whose drain is connected to the control electrode of the current injection transistor.

Likewise, a protection from the inversion of the direction of connection of the main supply voltage can be obtained in that a second protection diode is connected in the normally forward direction of the protection transistor between the source electrode of the protection transistor and the control terminal. Protection from overvoltages can also be obtained in that a third protection diode is arranged between the gate and the source of at least one MOS transistor and connected in the direction inverse to the forward direction of the latter.

The discrimination of the different operating states of the relay is advantageously obtained by means of a detection circuit receiving the detection signal present at the control terminal and comparing it with a plurality of reference voltages obtained by division of the voltage applied to the main supply terminal and corresponding to the different operating states, and by a circuit for inhibiting the relay to be made operative when a short-circuit state is detected by the detection circuit.

According to a second modification constituting a preferred modification, the control signal is applied to the gate of a control transistor and the detection signal obtained at the collector of the detection transistor is directly used to obtain a self-bias of the relay.

The relay for this purpose comprises a control transistor whose source is connected to the common terminal, whose drain is connected to the control electrode of the current injection transistor and whose gate is controlled via the control terminal and is connected on the one hand to the common terminal through a self-maintenance resistor and on the other hand to the collector of the detection transistor via a fourth diode connected in the normally forward direction of the current originating from the collector of the detection transistor so that a self-bias voltage is applied to the gate of the control transistor in the normal state of the load.

In order to protect the relay when the main supply is cut off, a resistor is connected in series between the drain of the control transistor and the control electrode of the current injection transistor.

However, such a protection is ensured in a more rational manner by a protection field effect MOS transistor, whose gate is connected to the main supply terminal, whose source is connected to the drain of the control transistor and whose drain is connected to the control electrode of the current injection transistor.

According to an embodiment, the relay delivers a detection signal corresponding to a logic state. For this purpose, the relay comprises a transistor of the enhancement type having a channel of the first type, whose drain-source path is connected parallel to the self-maintenance resistor and whose gate is connected to the said control terminal, as well as a logic circuit formed by two series-connected detection field effect MOS transistors of the enhancement type, whose channels are of opposite type to each other. The first transistor of these two transistors has its gate connected to the control terminal and the second transistor has its gate connected to the gate of the current injection transistor so that a detection signal having two states is transmitted to a logic detection terminal.

An on/off control of the relay is also possible due to a calibrated pulse generator circuit comprising a first and a second resistor, each of which has an electrode connected to the auxiliary supply terminal, while its other electrode is connected to a respective electrode of a capacitor. The electrode common to the capacitor and to the second resistor is connected to the gate of a MOS field effect transistor of the enhancement type having a channel of the second conductivity type, whose source is connected to the auxiliary supply terminal and whose drain is connected to the gate of the control transistor. The junction of the capacitor and the first resistor is connected to the control terminal so that, when the control terminal is grounded, the pulse generator circuit produces a starting pulse.

According to a first embodiment, the first transistor of the logic circuit has a channel of the second conductivity type and has its drain connected to the common terminal and has its source connected to that of the second transistor of the logic circuit, the latter having its drain connected to the logic detection terminal.

According to a second embodiment, the first transistor of the logic circuit has a channel of the second conductivity type and has its drain connected to the logic detection terminal and has its source connected to that of the second transistor, whose drain is connected to the auxiliary supply terminal.

According to an advantageous modification, the control terminal is acted upon by a logic field effect MOS control transistor of the enhancement type, whose drain-source path is connected between the common terminal and the control terminal so that its gate receives a logic command, for example TTL.

The self-bias of the relay can also be obtained in that a second self-maintenance resistor is made operative. This latter resistor is arranged between the collector of the detection transistor and the non-grounded electrode of the first self-maintenance resistor so that it forms with it a voltage divider.

BRIEF DESCRIPTION OF THE DRAWINGS

In order that the invention may be readily carried into effect, it will now be described more fully, by way of example, with reference to the accompanying drawing, in which.

DESCRIPTION OF THE PREFERRED EMBODIMENTS

Figure 1A:
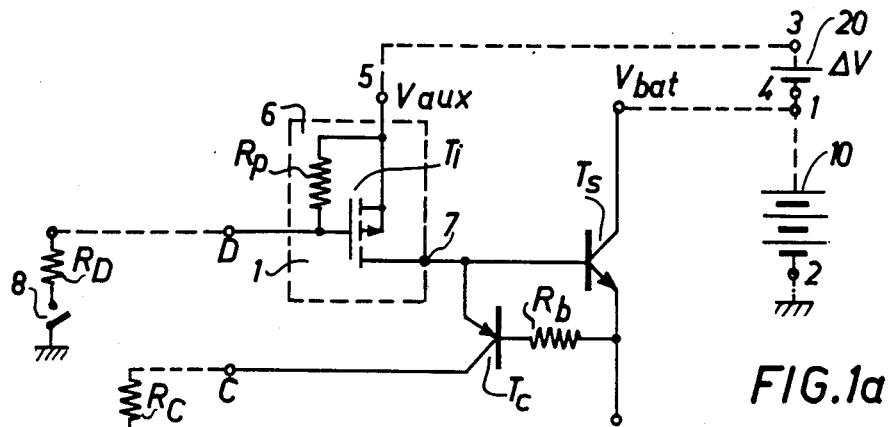
FIG. 1a shows diagrammatically a relay according to the invention with an injection field effect transistor, which in FIG. 1b is of the bipolar type.

In FIG. 1a, a bipolar transistor $T_s$ of the npn type in the chosen embodiment has its emitter-collector path connected between a first terminal 1 of a main supply source 10 and a first connection 12 of a load Z. The other terminal 2 of the supply source and the other connection of the load are each connected to a common terminal. The main supply source is a low voltage DC supply source, whose voltage $V_{bat}$ has a value of, for example, 12 V in the case of a battery.

A first output terminal 3 of an auxiliary voltage generator 20 is connected to the terminal 5 of a current injection device 6 shown in the figure by broken lines, another terminal 7 of this device being connected to the base of the bipolar transistor $T_s$. The second output terminal 4 of the generator 20 is connected to the first terminal 1 of the main supply source. The voltage $V_{aux}$ delivered by the auxiliary generator 20 has a relatively low value, i.e. close to, but exceeding by a value $\Delta V$ the base-emitter voltage of the bipolar transistor $T_s$ when this transistor is conducting. A value of 2 V may be stated by way of example.

Therefore, the power dissipated for controlling the base of the transistor $T_s$ is considerably reduced, in the ratio of the voltage $V_{aux}$ of the auxiliary generator 20 to that ($V_{bat}$) of the main supply source 10.

If the relay is used in an automobile, the auxiliary generator 20 is a switched-mode voltage converter known per se which extracts its energy from the voltage $V_{bat}$ of the main supply source 10. On the contrary, in other applications, it will be clear that the auxiliary voltage $V_{aux}$ can be obtained, for example, by means of a stabilized independent supply source.

The control device 6 comprises a field effect transistor $T_i$, designated as a current injection transistor of the enhancement type having a p-type channel. The source-drain current path of FET $T_i$ is arranged in series in the connection lead between the base of the transistor $T_s$ and the terminal 3 of the auxiliary generator 20.

A resistor could moreover be connected in series in this circuit so that the base current of the bipolar transistor $T_s$ is limited to the desired value. However, when the injection transistor $T_i$ is made to conduct, its source-drain resistance may also act as a limiting resistance so that in the Figure no additional resistor is shown. In the simple case described by way of example, the control device 6 is completed by a voltage divider comprising resistors $R_p, R_d$ in series with a control interruptor 8 coupled to the reference potential $V_{aux}$ of the auxiliary supply source 20. The junction D between the resistors $R_p$ and $R_d$, which constitutes a control terminal of the relay, is at a potential whose value depends upon the state of the control interruptor 8. Consequently, it forms a control signal for the operation of the interruptor circuit, which signal is applied to the gate of the field effect transistor $T_i$.

It is clear that any other circuit that would deliver a control signal with the same voltage levels to be applied to the gate of the field effect transistor $T_i$ would also be suitable. Thus, the control device 6 could take various forms to fulfil all kinds of switching functions, the example described here being representative only of a particularly simple and advantageous embodiment of the invention. The use in all cases of an output field effect transistor for the control device is to be preferred because, controlled by a voltage, such a transistor type does not require a substantial amount of power for its control.

Figure 1B:
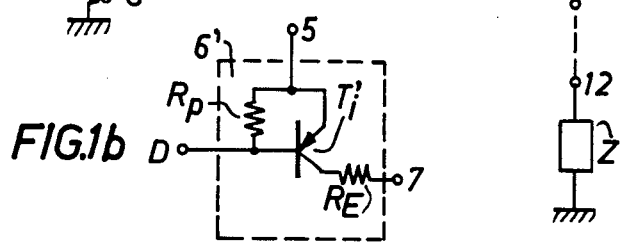

FIG. 1b shows a single part of the interruptor circuit relative to a current injection device 6 very close to that of FIG. 1a, but in a version comprising a bipolar transistor instead of the field effect transistor. The elements corresponding to those of FIG. 1a have the same reference numerals.

In FIG. 1b, the emitter-collector path of a bipolar injection transistor $T_i'$ of the pnp type constitutes the essential part of the coupling between the terminal 3 of the auxiliary supply source 20 connected to the terminal 5 of the current injection device 6 and the base of the transistor $T_s$ connected to the terminal 7 of this device. A resistor $R_E$ is connected, however, in series in the connection of the collector of the transistor $T_i'$, which resistor limits the value of the base current of the transistor $T_s$. Otherwise, the current injection device 6' of FIG. 1b operates in the same manner as that of FIG. 1a, the operation control signal delivered at the junction D between the resistors $R_P$ and $R_D$ being applied to the base of the transistor $T_i'$.

A detection transistor $T_c$, in this case of the pnp type, opposite to that of the transistor $T_s$, has its emitter-base path connected parallel to the base-emitter path of the transistor $T_s$, that is to say that its emitter is connected to the base of the transistor $T_s$ and its base is connected to the emitter of the transistor $T_s$.

The detection transistor $T_c$ has a base resistor $R_b$. The collector of the detection transistor $T_c$ is connected to a detection terminal C, which is itself connected to ground through a detection resistor $R_c$ in a manner such that a detection voltage is available at the terminal C in conditions which will be indicated in the following part of the description.

Figure 2A:
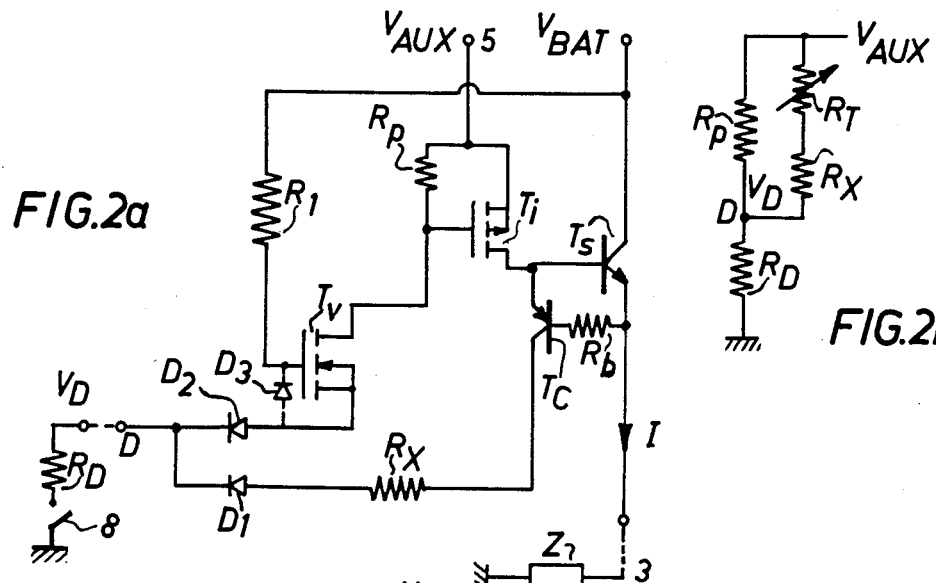
FIG. 2a shows a modification of the relay according to the invention, in which the control and the detection are effected via a single terminal, FIG. 2b showing an equivalent circuit diagram illustrating the error detection.

According to FIG. 2a, the relay includes a field effect MOS protection transistor $T_v$ of the enhancement type having an n-type channel, whose drain-source path is connected between the gate of the current injection transistor $T_i$ and the control terminal D, its drain being connected to the gate of the injection transistor $T_i$ and its source being connected to the control terminal D. The gate of the protection transistor $T_v$ is coupled to the main supply voltage $V_{bat}$ in a manner such that, if the latter is interrupted, no current is delivered by the drain of the protection transistor $T_v$, which causes the transistor $T_i$ and the transistor $T_s$ to be inoperative. Of course, if the circuit does not require protection from disconnection of $V_{bat}$, the transistor $T_v$ can be omitted, the gate of the transistor $T_i$ then being in communication with the terminal D. The collector of the detection transistor $T_c$ is connected to the control terminal D through a diode $D_1$ connected in the normally forward direction for the current originating from the collector of the transistor $T_c$ in order to prevent a reflux of the current. As in FIG. 1, the control terminal is connected to ground through a resistor $R_d$ when the interruptor 8 is closed.

It can further be seen from FIG. 2a that two components ($R_1, D_3$) are present, which only have the function of providing protection in the case of an excess value of the main supply voltage $V_{bat}$. The resistor $R_1$ is therefore arranged in series in the gate of the transistor $T_v$ and the diode $D_3$ is arranged between the gate and the source of $T_v$ in the inverse direction when the voltage $V_{bat}$ is in the normal direction.

Figures 3A, 3B:
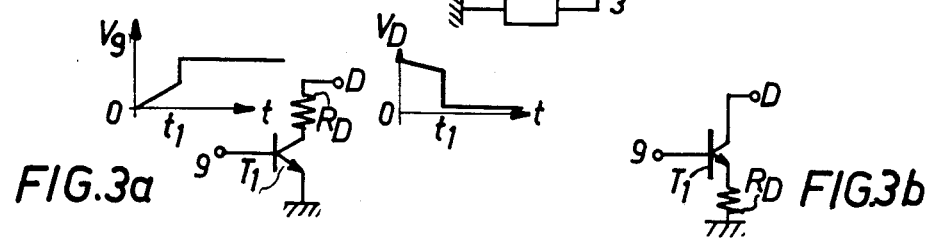
FIGS. 3a and 3b show two modifications of an interruptor comprising a bipolar transistor that can be used for controlling the relay shown in FIG. 2, FIGS. 4a and 4b show a diagram of the voltages received at the control terminal D of FIG. 2 in various configurations and the curve as a function of time of the ignition current delivered by the transistor $T_s$ to a load constituted by an electric bulb, respectively.

Two modifications of the interruptor are shown in FIGS. 3a and 3b. In FIG. 3a, a bipolar transistor $T_1$ receives a control signal at its base 9, its emitter being connected to ground and its collector being connected to the control terminal D through the resistor $R_d$. According to FIG. 3b, the transistor $T_1$ receives a control signal at its base 9, but its emitter is connected to ground through the resistor $R_D$, while its collector is directly connected to the control terminal D.

In FIG. 3a, the form of the signal $V_9$ is also shown, which is to be applied to the base of the transistor $T_1$ in order to obtain a detection of the progressive conduction of the relay equivalent to the arrangement in series of a high-value resistor with $R_D$, this high value being progressively reduced during a time $t_1$, which permits the detection of the supply of current in the load Z. The voltage $V_9$ is in the form of a ramp leading to a progressive reduction of $V_D$ and then at the time $t_1$ abruptly passes to its nominal value, $V_D$ then dropping to a value close to 0. This introduces only a small delay in the execution of the process.

Figure 4A:
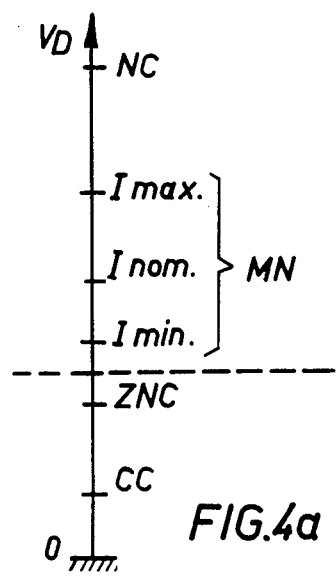

In FIG. 4a, an explanation will now be given about what happens at the level of the detection terminal D of FIG. 2a according to the different states of the relay and of the load Z.

When the relay is not controlled (NC), the interruptor 8 being open, the source of the transistor $T_v$ is coupled to a high potential, $T_i$ and $T_s$ are cut off and no current flows through the collector of $T_c$. $T_c$ in this situation does not consume any power. A high voltage $V_D$ close to $V_{bat}$ is received at the control terminal D.

Figure 4B:
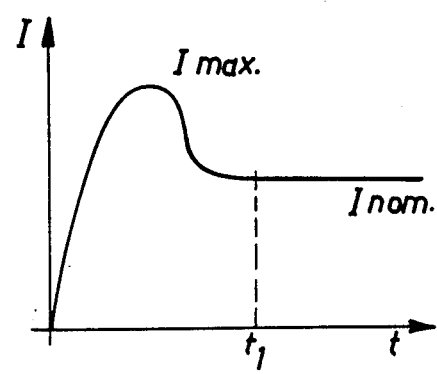

When the relay is controlled (interruptor 8 closed) and the state of the load is normal (MN; $I_{min} < I < I_{max}$), the voltage $V_D$ is established at a value which is smaller than before and is higher as I is closer to $I_{max}$. This is due to the fact that the collector of the transistor $T_c$ delivers to $R_D$ a current which increases as a function of the current I. The maximum current $I_{max}$ corresponds (see FIG. 4b) to the case of ignition of an electric bulb or of an inductive load, the current attaining transiently a maximum before it stabilizes on the nominal current $I_{nom}$. When the relay is controlled and the state of the load is abnormal, i.e. the case where the load is not connected (for example, the bulb of a car headlight is in the inoperative state) or the case where the load is shortcircuited.

In the first case, i.e. non-connected load (ZNC), the collector of $T_s$ delivers accurately the injection current at the terminal $V_{bat}$. The emitter of $T_s$ is practically at the voltage $V_{bat}$ and the detection transistor $T_c$ generates a voltage $V_D$ much lower than the voltage in normal operation at the control terminal D.

In the second case, i.e. a shortcircuited load (CC), the emitter of $T_s$ is grounded, the detection transistor $T_c$ is saturated and its collector delivers a current even smaller than before, which becomes manifest at the control terminal D in a voltage $V_D$ also smaller than before.

Summarizing, in the modification shown in FIG. 2a, the normal operation states (MN) (relay cut off, load normal) produce voltages $V_D$ lying in a high range at the control terminal D, while the variations in operation (ZNC, CC) induce at this terminal small voltages $V_D$. It is to be noted that in the case of FIG. 1a, in which the terminals C and D are independent, the state in which the relay is non-controlled (NC) corresponds to a zero voltage at the terminal C.

The circuit of FIG. 2a has another advantage. When the battery voltage $V_{bat}$ is present, the transistor $T_v$ is equivalent to a closed interruptor and $V_D$ controls the gate of the injection transistor $T_i$. If the current has a tendency to exceed $I_{max}$ for some reason or other, the current delivered by the collector of the detection transistor $T_c$ and hence the voltage $V_D$ increases, so the gate voltage of the injection transistor $T_i$ induces a progressive blocking of this transistor.

Figure 2B:
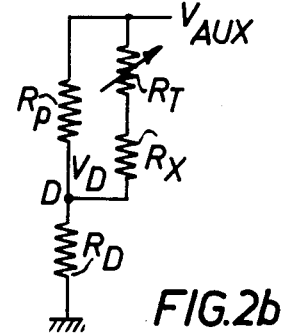

It should be noted that a resistor $R_x$ can be connected in the collector of the detection transistor $T_c$. In the normal state of the load, the transistor $T_c$ is not saturated and its collector is a current generator, the resistor $R_x$ having no influence on the voltage $V_D$. On the contrary, in the case of a shortcircuit (CC), the transistor $T_c$ no longer operates as a current generator and the resistor $R_x$ permits a reduction of the potential $V_D$. More particularly, in FIG. 2b, in which the voltage drops of the junctions of the semiconductor elements are neglected, $T_c$ is equivalent to a variable controlled resistor $R_T$ parallel to $R_p$. $R_x$ is arranged in series with $R_T$.

In the case of normal operation, the resistor $R_T$ has a high value, which results in the transistor $T_c$ operating as a current generator. In the case of a short-circuited load, (CC), $R_T$ has a low value.

Figure 5A:
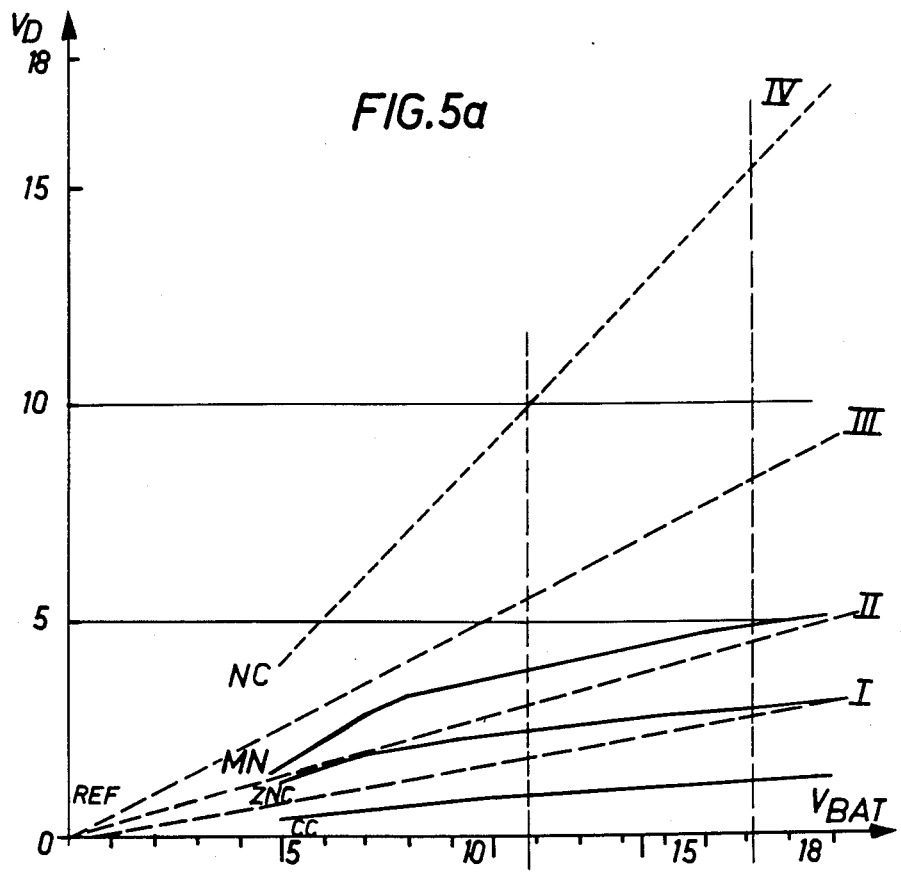
FIGS. 5a and 5b show for each state of the device the voltage available at the terminal D of FIG. 2 as a function of the variations of the main supply voltage and the bundle of curves obtained by causing the voltage difference between the main supply voltage and the auxiliary supply voltage also to vary.

In FIG. 5a, the values of the voltages $V_D$ received at the control terminal D in the different configurations of the load are shown, i.e. shortcircuit (CC), non-connected load (ZNC) and operation in the normal state (MN); $I_{nom}$) and (NC) as a function of the voltage $V_{bat}$ lying between 5 and 18 V. It is found that these different curves can be discriminated by a network of straight separation lines I,II,III,IV passing on first approximation through the origin O, the separation being larger as the voltage $V_{bat}$ is higher.

Figure 5B:
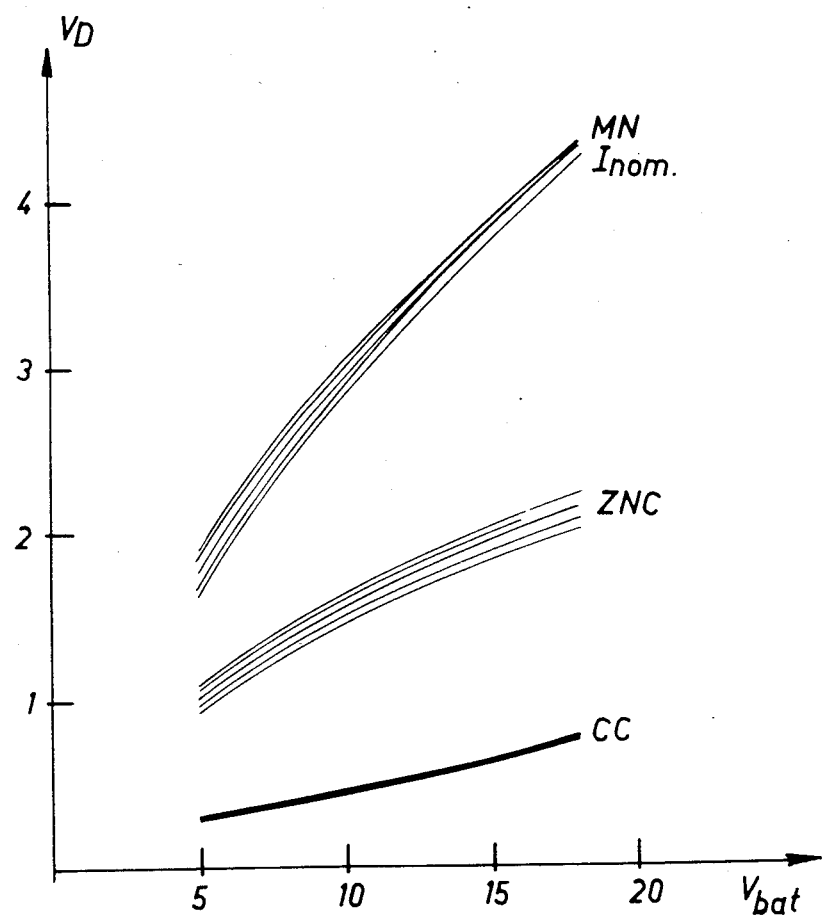

In FIG. 5b, the values of the voltages $V_D$ are represented in the normal operating states ($I_{nom}$), non-connected load (ZNC) and shortcircuit (CC) as a function of the variations of the main supply voltage $V_{bat}$, the bundle of curves being obtained by causing $\Delta V = V_{aux} - V_{bat}$ to vary between 1.5 and 2.5 V. It is found that the bundle of curves is not strongly dispersed when $\Delta V$ varies considerably.

Figure 6:
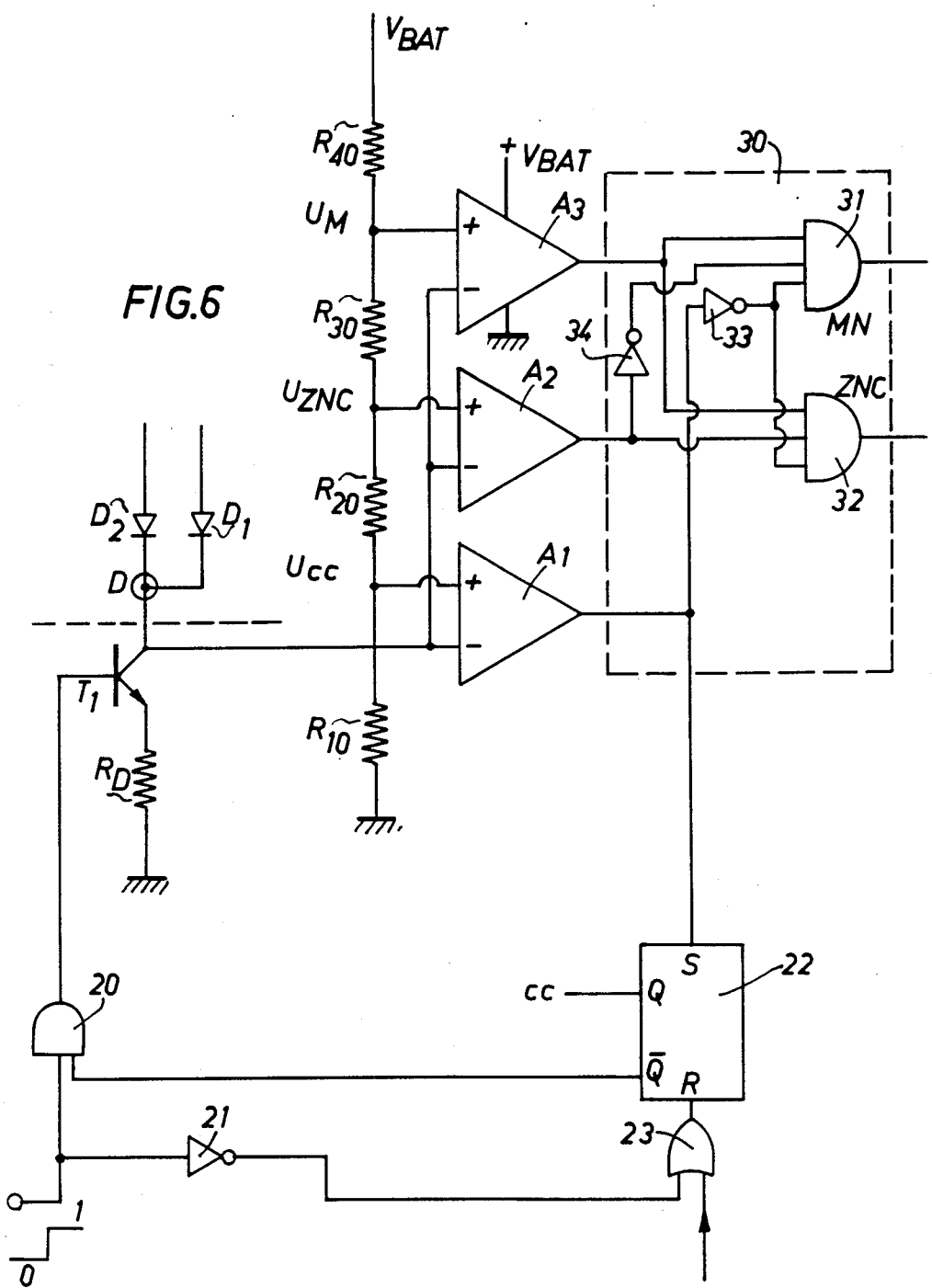
FIG. 6 shows a logic diagram of the exploitation of the information available at the terminal D of FIG. 2.

FIG. 6 shows a logic circuit that can be associated with the circuit shown in FIG. 2a. The voltage $V_D$ present at the point D is introduced at the inverting input of three comparators $A_1, A_2$ and $A_3$ fed by a single voltage $V_{bat}$ according to an on/off mode while producing at their output either a maximum voltage corresponding to a logic level "1" or 0 V corresponding to a logic level "0". It has a network of resistors comprising four resistors $R_{10}, R_{20}, R_{30}$ and $R_{40}$ arranged in series between a supply terminal of the voltage $V_{bat}$ and a common connection terminal. The junction between the resistors $R_{10}$ and $R_{20}$ is connected to the non-inverting input of the comparator $A_1$ and the junction between the resistors $R_{20}$ and $R_{30}$ is connected to that of the comparator $A_2$, while the junction between the resistors $R_{30}$ and $R_{40}$ is connected to that of the comparator $A_3$. Thus, the non-inverting input of $A_1$ receives a voltage $U_{CC}$ higher than the voltage present at the terminal D in the case of short-circuit, but smaller than that which would be present in the case of a non-connected load. The non-inverting input of $A_2$ receives a voltage $U_{ZNC}$ higher than the voltage present at the terminal D in the case of a non-connected load, but smaller than that which would be present in the case of a normal current in the load ($I = I_{nom}$) and the non-inverting input of $A_3$ receives a voltage $U_M$ higher than the voltage present at the terminal D in the case of a maximum current in the load ($I = I_{max}$) and smaller than that which would be present in the case in which the relay is non-controlled.

Consequently, the comparator $A_1$ delivers at the output a logic level "1" in the case of a shortcircuit, the comparator $A_2$ delivers a logic "1" signal in the case of a shortcircuit or of a non-connected load and the comparator $A_2$ delivers a logic "1" signal in the case of a shortcircuit, of a non-connected load or of normal operation.

The discrimination of the states is obtained by a logic circuit 30 comprising two AND gates 31 and 32 each having three inputs. The AND gate 31 receives at its inputs the output signal of the comparator $A_3$ and those of the comparators $A_1$ and $A_2$ after inversion by inverters 33 and 34, respectively. The AND gate 31 produces consequently at its output a logic signal characteristic of the normal operating state of the relay. It should be noted that from the logic viewpoint the connection between the inverted output $A_1$ and the AND gate 31 is redundant, the output of the amplifier $A_2$ discriminating the cases in which there exist a shortcircuit and a non-connected load.

The AND gate 32 receives at its inputs the output signal of the comparators $A_3$ and $A_2$ and that of the comparator $A_1$ after inversion by the inverter 33. Consequently, the AND gate 32 produces at its output a signal characteristic of the state in which the load Z is not connected (ZNC).

The output signal of the amplifier $A_1$ is also used for blocking the relay because of the risk to the transistor $T_s$ by a shortcircuit of its load Z. The output signal of the amplifier $A_1$ is therefore introduced at the activation input S' of a trigger circuit 22, which stores any occurrence of a shortcircuit. The starting of the relay is then obtained in the following manner. The starting signal is constituted by the presence of a logic "1" at an input of an AND gate 20, whose output is connected to the base of the transistor $T_1$, which is connected in the manner shown in FIG. 3b. The other input of the AND gate 20 receives the signal present at the output $\overline{Q}$ of the trigger circuit 22, which delivers a logic "0" in the case of a shortcircuit of the load.

The re-activation of the relay after a shortcircuit can take place in two different ways. For this purpose, the zero reset input R of the trigger circuit 22 is connected to the output of an OR gate 23, which receives either the starting signal inverted by an inverter 21 or a reactivation logic control signal. If the network of resistors $R_{10}, R_{20}, R_{30}, R_{40}$ is fed by a voltage $V_{bat}$, the resistors $R_{10}, R_{20}, R_{30}$ and $R_{40}$ can be chosen so that $U_{CC}$, $U_{ZNC}$ and $U_M$ correspond to the straight separation lines I to III of FIG. 5a. A better separation with respect to the low voltages can be obtained if $R_{10}$ is replaced by a non-linear resistor, such as a diode, or if this resistor is connected in series with such an element.

Figure 7A:
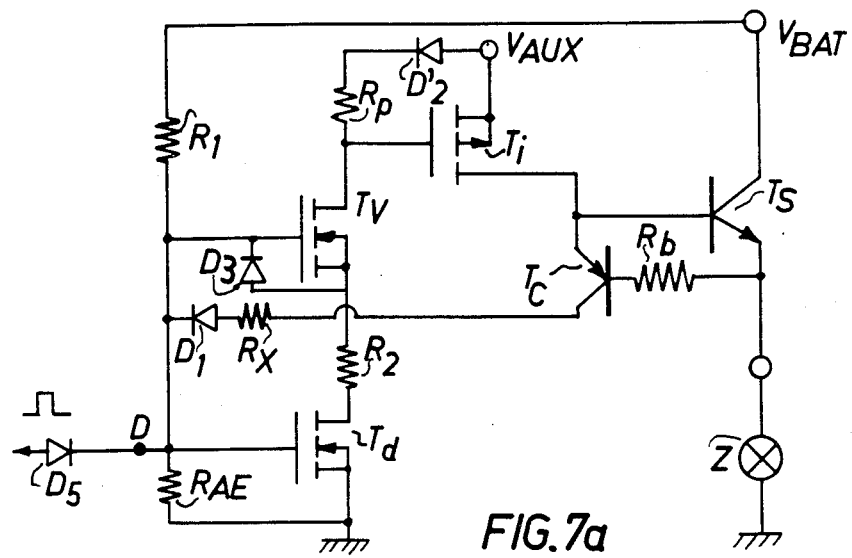
FIG. 7a shows a second modification of the relay according to the invention, in which the detection signal is utilized for the self-maintenance of the relay, FIG. 7b being an equivalent circuit diagram illustrating the error detection.

According to the embodiment shown in FIG. 7a, the signal transmitted to the control terminal D through an isolation diode $D_5$ is received by the gate of a MOS field effect control transistor $T_d$ of the enhancement type having an n-type channel, whose drain in turn controls the gate of the injection transistor $T_i$. The relay is self-maintained and can thus be controlled by a pulse. This pulse has a duration sufficiently long to force the control during the increase of the current through the load Z. The source of the control transistor $T_d$ is connected to ground, while its drain is connected to the gate of the transistor $T_i$ through the source-drain path of the safety transistor $T_v$, which acts as an open interruptor when the main supply voltage $V_{bat}$ is absent, this interruptor being closed in the opposite case. The transistor $T_v$ need only be provided if a protection from the interruption of the main supply voltage $V_{bat}$ is desired. This function can otherwise be fulfilled by a limiting resistor $R_2$ of low value arranged between the drain of the transistor $T_d$ and the gate of the injection transistor $T_i$. The resistor $R_2$ can also be present when a safety transistor $T_v$ is used. It can further be seen that a protection diode $D_2'$ is otpionally present, which fulfils the same function as the diode $D_2$ of FIG. 2a and is connected in the forward direction between the supply terminal of the auxiliary voltage $V_{aux}$ and the resistor $R_p$.

The collector of the detection transistor $T_c$ is connected to the control terminal D through a diode $D_1$, as in the case of FIG. 2a, but now not to fulfil the function of discriminating the different states of the relay, but of self-biasing the latter.

For this purpose, a so-called self-maintanance resistor $R_{AE}$ is arranged between the gate of the control transistor $T_d$ and ground. The resistor $R_x$ fulfils the same function as in the preceding cases.

Figure 7B:
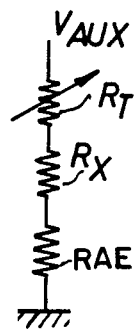

According to the equivalent circuit diagram of FIG. 7b, the controlled resistor $R_T$ is connected in series with the resistors $R_x$ and $R_{AE}$. In the case of errors, they form a divider bridge which permits the control transistor $T_d$ to be cut off more readily. The choice of the resistors $R_x$ and $R_{AE}$ depends upon the amplification of the detection transistor $T_c$ and upon the threshold voltage of the control transistor $T_d$.

If the relay is in the integrated monolithic form, it is to be noted that the transistor $T_c$ will generally be a lateral transistor having an amplification lower than or equal to 30. In such a case, a resistor $R_b$ of the order of 1 k Ω is suitable. The value of $R_b$ once having been adjusted, the regulation of the self-maintenance is obtained by influencing the value of $R_{AE}$ in a manner such that, as soon as the voltage at the terminal D approaches that corresponding to the condition of a non-connected load, the control transistor $T_d$ becomes inoperative. Furthermore, the protection circuit of the transistor $T_v$ is considered. In the case of overvoltage at the level of the supply voltage $V_{bat}$, the source-gate voltage of the transistor $T_v$ is limited to the breakdown voltage of a diode $D_3$ connected in the reverse direction, the current being limited by a resistor $R_1$.

Figure 8:
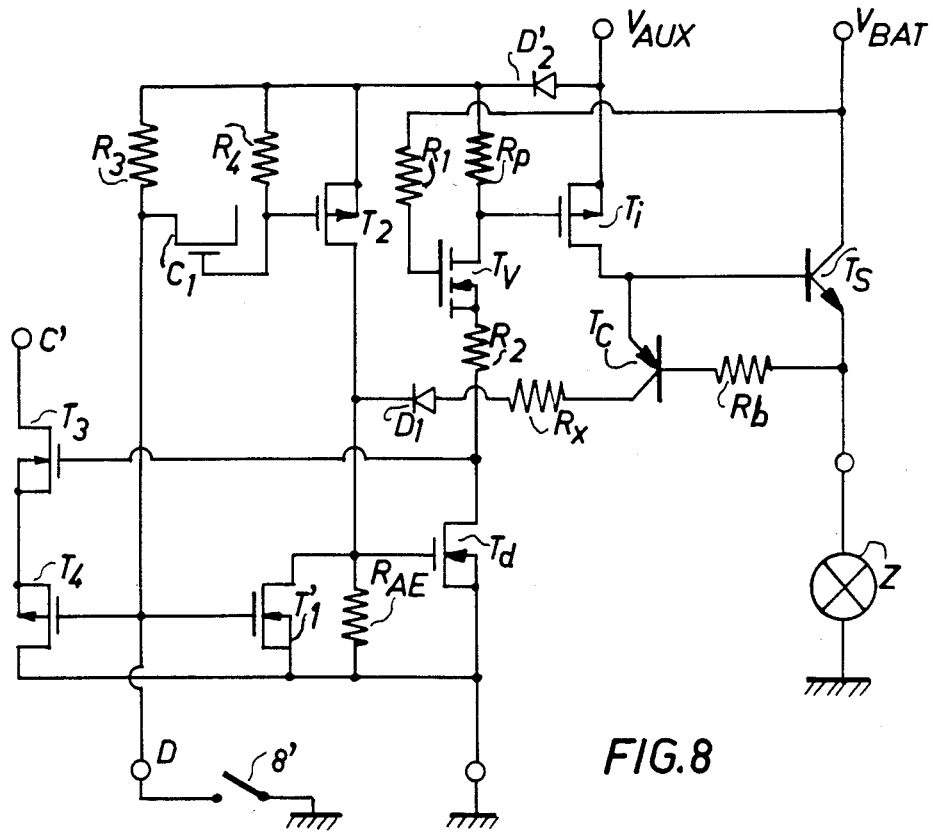
FIGS. 8 and 9 show two embodiments according to FIG. 7a, in which the control and the detection are effected in logic form.

The embodiment shown in FIG. 8 permits of controlling the relay by closing a control interruptor 8'. For this purpose it comprises a calibrated pulse generator comprising two resistors $R_3$ and $R_4$ having a common electrode connected to the auxiliary supply source $V_{aux}$, their other electrode being connected to each of the respective electrodes of a capacitor $C_1$, for example the internal capacitance of an integrated MOS transistor. The terminal common to the capacitor $C_1$ and to the resistor $R_4$ is connected to the gate of a MOS field effect transistor $T_2$ of the enhancement type having a p-type channel, whose source is coupled to the auxiliary voltage $V_{aux}$ and whose drain, which constitutes the output of the pulse generator, is connected to the gate of the control transistor $T_d$. The terminal common to the capacitor $C_1$ and to the resistor $R_3$ is connected to the control terminal D. When the latter is connected to ground by closing the interruptor 8', the gate of the transistor $T_2$ is instantaneously at the potential O and the capacitor $C_1$, one electrode of which is connected to ground, is charged through $R_4$ with a time constant $R_4 C_1$. The transistor $T_2$ consequently has its emitter-drain path connected in the forward direction as long as its gate potential has not increased again to a sufficient level, which occurs at the end of a given period of time due to the charging of the capacitor $C_1$. Therefore, a pulse is received at the drain of $T_2$ feeding the gate of the control transistor $T_d$ so that the latter is rendered conducting. The junction between the gate and drain of $T_2$ is equivalent to the diode $D_5$ of FIG. 7a. After the pulse at the drain of $T_2$ has disappeared, the relay is self-biased, as in the case of FIG. 7a.

A MOS field effect transistor $T_1'$ of the enhancement type having an n-type channel has its drain-source path to the terminals of the self-maintenance resistor $R_{AE}$, its source being connected to ground. The gate of the transistor $t_1'$ is connected to the control terminal D. When the interruptor 8' is opened, the gate of the transistor $T_1'$ is at a high potential and the transistor $T_1'$ shortcircuits the transistor self-bias resistor $R_{AE}$, as a result of which the gate of the control transistor $T_d$ is connected to ground, which causes the relay to be deactivated. On the contrary, when the interruptor 8' is closed, the gate of the locking transistor $T_1'$ is connected to ground and the resistor $R_{AE}$ is no longer shortcircuited.

The circuit of FIG. 8 also provides a logic detection terminal C' controlled by a logic detection circuit comprising two MOS field effect transistors $T_3$ and $T_4$ of the enhancement type, whose channels are of opposite types. The transistor $T_3$ has an n-type channel and has its drain connected to the logic detection terminal C', its gate connected to the drain of the control transistor $T_d$ and its source connected to that of the transistor $T_4$ having a p-type channel. The gate of $T_4$ is connected to the control terminal D and its drain is connected to the common connection terminal. The logic terminal C' operates according to the following truth table:

| | |
|---|---|
| STOP | 1 |
| (8' open) | |
| START | 1 |
| (8' closed) | |
| START ± ZNC | 0 |

| -continued |   |
|---|---|
| START + CC | 0 |

Figure 9:
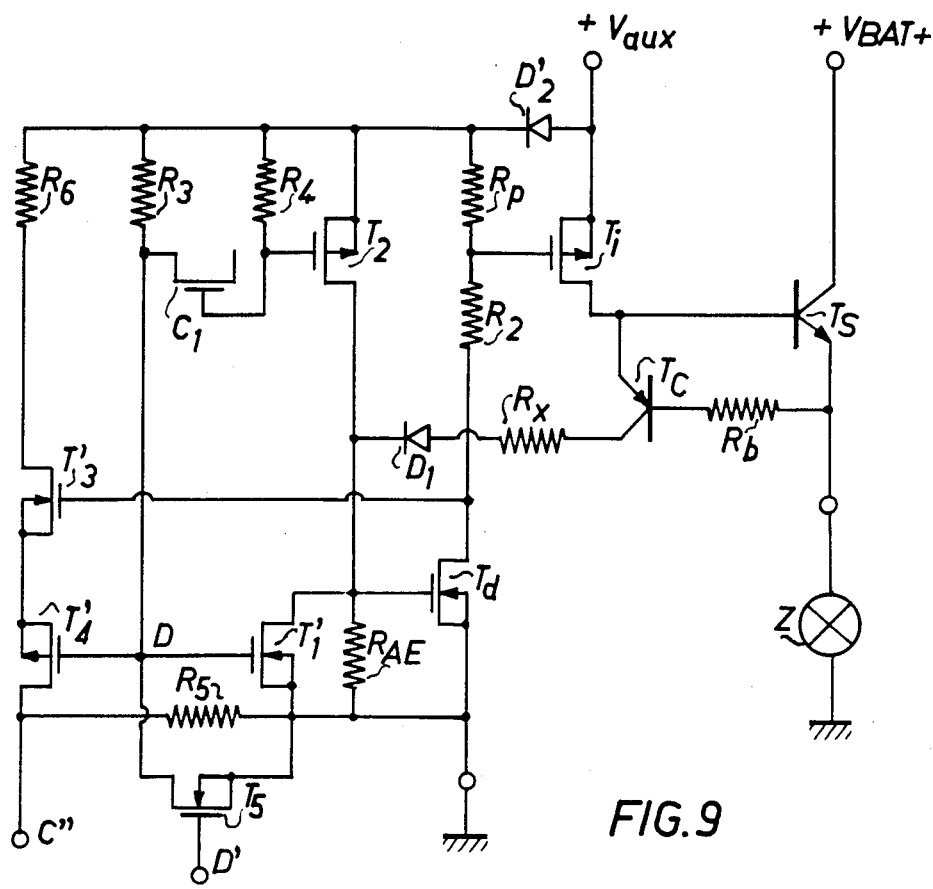

The circuit shown in FIG. 9 is distinguished from the preceding circuit in the first place by the presence of a logic control terminal D' connected to the gate of a logic MOS field effect transistor $T_5$ of the enhancement type.

If, as shown, the latter has an n-type channel, the source being connected to ground and its drain being connected to the control terminal D, a logic "1" signal at the gate of the transistor $T_5$ renders its emitter-drain path conducting and causes the relay to become operative. If the transistor $T_5$ has a p-type channel, its source being connected to the control terminal D and its drain being connected to ground, the control is effected at the logic terminal D' according to an inverse logic.

It is further distinguished by a variation of the logic control circuit operating according to a logic inverse to that of the preceding Figure.

The transistors $T_3'$ and $T_4'$ are connected in the same manner as before except that the drain of the transistor $T_4'$ constitutes a good control logic C" and is connected to ground through a division resistor $R_5$ so as to be compatible with logic levels (for example TTL), while the drain of the transistor $T_3'$ is connected to the auxiliary supply voltage $V_{aux}$ through a resistor $R_6$.

What is claimed is:

1. A static relay for low DC-voltages to be supplied to a load comprising: a bipolar output transistor of a first conductivity type having an emitter connected to an output terminal to which the load is to be connected, the load to be further connected to a common supply terminal, means for connecting a collector of the output transistor to a main supply terminal, a base of the output transistor being supplied by means of the main current path of a current injection transistor having a control electrode coupled to a control terminal which receives a control signal that causes said current injection transistor and the bipolar output transistor to become conductive, a bipolar detection transistor of a second (opposite) conductivity type having an emitter-base path including a base resistor, said emitter-base path being connected parallel to the base-emitter path of the bipolar output transistor, and wherein a collector of the detection transistor produces a signal representative of the state of the load.

2. A static relay as claimed in claim 1, characterized in that one main electrode of said current injection transistor is connected to an auxiliary supply terminal.

3. A static relay as claimed in claim 1, characterized in that the said current injection transistor comprises a MOS enhancement type field effect transistor having a channel of the second (p) conductivity type, and a gate, which constitutes said control electrode, connected through a polarization resistor to its source, while its drain feeds the base of the bipolar output transistor.

4. A static relay as claimed in claim 3, wherein the drain of the current injection transistor is directly connected to the base of the bipolar output transistor, the internal resistance ($R_{on}$) of the current injection transistor serving as a current limiting resistor for the base current of the output transistor.

5. A static relay as claimed in claim 1 characterized in that the collector of the detection transistor is connected to the control terminal through a first protection diode connected in the normally forward direction for a current originating from the collector of the detection transistor so that the control terminal also serves to deliver a detection signal.

6. A static relay as claimed in claim 5, further comprising a MOS field effect protection transistor having a gate connected to the main supply terminal, a source connected to the control terminal and a drain connected to the control electrode of the current injection transistor whereby the protection transistor provides the coupling between the control terminal and the control electrode of the current injection transistor.

7. A static relay as claimed in claim 6, further comprising a second protection diode connected in the normally forward direction of the protection transistor and connected between the source of the protection transistor and the control terminal.

8. A static relay as claimed in claim 7, characterized in that it comprises a third protection diode connected between the gate and the source of the protection transistor and arranged in a direction opposite to the forward direction of said transistor, and in that the connection between the gate of the protection transistor and the main supply terminal includes a series connected protection resistor.

9. A static relay as claimed in claim 5, characterized in that it comprises a detection circuit receiving the detection signal present at the control terminal and comparing it with a plurality of reference voltages obtained by division of the voltage applied to the main supply terminal and corresponding to the different operating states, and a circuit inhibiting the activation of the relay when a shortcircuit state of the load is detected by the detection circuit.

10. A static relay for supplying low DC voltages to a load comprising:
a bipolar output transistor of a first conductivity type having an emitter connected to an output terminal to which the load is to be connected, the load to be further connected to a common supply terminal, means for connecting a collector of the output transistor to a main supply terminal, a base of the output transistor being supplied by means of a main current path of a current injection transistor having a control electrode, a bipolar detection transistor of a second (opposite) conductivity type having an emitter-base path including a base resistor, said emitter-base path being connected parallel to the base-emitter path of the bipolar output transistor, a control transistor having a source connected to the common supply terminal, a drain coupled to the control electrode of the current injection transistor and a gate controlled via a control terminal which receives a control signal that causes said current injection transistor and the bipolar output transistor to become conductive, and means connecting the gate of the control transistor to the common supply terminal via a self-maintenance resistor and to a collector of the detection transistor via a diode connected in the normally forward direction for a current originating from the collector of the detection transistor whereby a self-maintenance voltage is applied to the gate of the control transistor in the normal state of the load, and wherein the collector of the detection transistor produces a signal representative of the state of the load.

11. A static relay as claimed in claim 10 further comprising a limiting resistor connected in series between the drain of the control transistor and the control electrode of the current injection transistor.

12. A static relay as claimed in claim 10, characterized in that it comprises a MOS field effect protection transistor by which the drain of the control transistor is coupled to the control electrode of the current injection transistor, said MOS field effect protection transistor having a gate connected to the main supply terminal, a source connected to the drain of the control transistor and a drain connected to the control electrode of the current injection transistor.

13. A static relay as claimed in claim 10 further comprising a transistor of the enhancement type having a channel of the first conductivity type, a drain-source path connected parallel to the self-maintenance resistor and a gate connected to the control terminal, and a logic circuit comprising two series-connected MOS field effect detection transistors of the enhancement type having channels of opposite types, the first transistor having a gate connected to the control terminal and the second transistor having a gate connected to the control electrode of the current injection transistor in a manner such that a detection signal having two states is produced at a logic detection terminal coupled to one of said first and second transistors.

14. A static relay as claimed in claim 13 further comprising, a calibrated pulse generator comprising a first and a second resistor each having one electrode connected to an auxiliary supply terminal and a second electrode connected to a respective electrode of a capacitor, the electrode common to the capacitor and to the second resistor being connected to a gate of a MOS field effect transistor of the enhancement type having a channel of the second conductivity type (p), a source connected to the auxiliary supply terminal and a drain connected to the gate of the control transistor, the junction between the capacitor and the first resistor being connected to the control terminal in a manner such that, upon connection of the control terminal to ground, the pulse generator circuit produces an activation pulse.

15. A static relay as claimed in claim 13, characterized in that the first transistor of the logic circuit has a channel of the second conductivity type (p), a drain connected to the common supply terminal and a source connected to a source of the second transistor of the logic circuit, a drain of the second transistor being connected to the logic detection terminal.

16. A static relay as claimed in claim 13, characterized in that the firsrt transistor of the logic circuit has a channel of the second conductivity type (p), a drain connected to the logic detection terminal and a source connected to the source of the second transistor, and means connecting a drain of the second transistor to an auxiliary supply terminal.

17. A static relay as claimed in claim 13, characterized in that the control terminal is coupled to a MOS field effect logic control transistor of the enhancement type having a drain-source path connected between the common supply terminal and the control terminal and with its gate receiving a logic control signal.

18. A static relay as claimed in claim 10, characterized in that it comprises a second self-maintenance resistor coupled between the collector of the detection transistor and an electrode of the first self-maintenance resistor such that it forms therewith a voltage divider.

19. A static relay as claimed in claim 2 wherein the current injection transistor comprises an enhancement type MOS field effect transistor having a p conductivity type channel and a gate electrode which forms said control electrode, a polarization resistor connected between the gate and source electrodes of the current injection transistor, the drain electrode of the current injection transistor being coupled to the base of the output transistor to supply current thereto.

20. A static relay as claimed in claim 2 further comprising a first protection diode connected between the collector of the detection transistor and the control terminal so that the control terminal delivers a detection signal.

21. A static relay as claimed in claim 10 wherein one main electrode of said current injection transistor is coupled to an auxiliary supply terminal providing a voltage that is higher than a voltage provided at the main supply terminal.

22. A static relay as claimed in claim 13 wherein one main electrode of said current injection transistor is coupled to an auxiliary supply terminal providing a voltage that is higher than a voltage provided at the main supply terminal.

* * * * *